(12) United States Patent
Waleh et al.

(10) Patent No.: US 8,066,819 B2
(45) Date of Patent: *Nov. 29, 2011

(54) METHOD OF REMOVING ORGANIC MATERIALS FROM SUBSTRATES

(75) Inventors: Ahmad Waleh, Palo Alto, CA (US); Eric O. Levenson, Los Altos, CA (US)

(73) Assignee: Best Label Co., Inc., Cerritos, CA (US)

( * ) Notice: Subject to any disclaimer, the term of this patent is extended or adjusted under 35 U.S.C. 154(b) by 2314 days.

This patent is subject to a terminal disclaimer.

(21) Appl. No.: 10/786,280

(22) Filed: Feb. 24, 2004

(65) Prior Publication Data

US 2004/0221876 A1 Nov. 11, 2004

Related U.S. Application Data

(63) Continuation-in-part of application No. 09/141,443, filed on Aug. 27, 1998, now abandoned, which is a continuation-in-part of application No. 08/772,072, filed on Dec. 19, 1996, now abandoned.

(51) Int. Cl.
*B08B 7/04* (2006.01)
*B08B 7/00* (2006.01)
*B08B 3/00* (2006.01)

(52) U.S. Cl. ............... 134/30; 134/1.3; 134/34; 134/38

(58) Field of Classification Search ............... 134/1, 1.3, 134/2, 3, 26, 28, 30, 34, 38, 39, 40, 41
See application file for complete search history.

(56) References Cited

U.S. PATENT DOCUMENTS

| | | | |
|---|---|---|---|
| 3,893,869 A | 7/1975 | Mayer et al. | 134/184 |
| 4,179,071 A | 12/1979 | Kozacka | 239/397.5 |
| 4,363,673 A | 12/1982 | Settineri et al. | 134/2 |
| 4,455,175 A | 6/1984 | Settineri et al. | 134/5 |
| 4,536,222 A | 8/1985 | Settineri et al. | 134/5 |
| 4,669,544 A | 6/1987 | Nimerick | 166/300 |
| 4,778,536 A | 10/1988 | Grebinski | 134/36 |
| 4,915,912 A | 4/1990 | Walles et al. | 422/160 |
| 5,024,968 A | 6/1991 | Engelsberg | 134/1 |
| 5,030,399 A | 7/1991 | Walles et al. | 264/83 |
| 5,037,506 A | 8/1991 | Gupta et al. | 134/902 |
| 5,114,834 A | 5/1992 | Nachshon | 216/48 |
| 5,158,100 A | 10/1992 | Tanaka et al. | 134/105 |
| 5,227,001 A | 7/1993 | Tamaki et al. | 156/345 |
| 5,531,857 A | 7/1996 | Engelsberg et al. | 134/1 |
| 5,643,472 A | 7/1997 | Engelsberg et al. | 134/1 |
| 5,763,016 A | 6/1998 | Levinson et al. | 427/510 |
| 5,952,157 A | 9/1999 | Kato et al. | 430/329 |

FOREIGN PATENT DOCUMENTS

WO WO9507152 3/1995
WO WO9717164 5/1997

OTHER PUBLICATIONS

Stanley Wolf and Richard N. Tauber, "Silicon Processing For The VLSI Era", *Process Technology*, vol. 1 (1986), p. 564.
"Choose the Right Process to Strip Your Photoresist", *Semiconductor International*, Feb. 1990, pp. 83-87. "New Concerns in Dry Oxygen Ashing", *Semiconductor International*, Mar. 1996, p. 44; and.
"What's Driving Resists Dry Stripping?", *Semiconductor International*, Nov. 1994, pp. 61-64.
Christina M. Cline, "Emerging Technology; Emerging Markets", *Precision Cleaning*, Oct. 1996, pp. 11-19.
Ruth DeJule, "Managing Etch and Implant Residue", *Semiconductor International*, Aug. 1997, pp. 56-63.
Hawley's Condensed Chemical Dictionary, p. 28, 1993.
Egelsberg, "Laser Assisted Cleaning Proves Promising", *Precision Cleaning*, 1994.

*Primary Examiner* — Alexander Markoff

(57) ABSTRACT

Water-free, gaseous sulfur trioxide is used as an agent to remove various organic coatings, films, layers and residues from the surface of a substrate when used in conjunction with certain other physical and chemical treatments applied at the appropriate time during the process.

30 Claims, 1 Drawing Sheet

METHOD OF REMOVING ORGANIC MATERIALS FROM SUBSTRATES

CROSS-REFERENCE TO RELATED APPLICATION

The present application is a continuation-in-part application of Ser. No. 09/141,443, filed Aug. 27, 1998 now abandoned, which in turn is a continuation-in-part application of Ser. No. 08/772,072, filed Dec. 19, 1996 now abandoned.

BACKGROUND OF THE INVENTION

1. Field of the Invention

The present invention is related to the removal, cleaning, and stripping of a wide variety of organic materials that may be deposited or formed on substrates during the manufacture, repair or rework of those substrates, using water-free sulfur trioxide in conjunction with additional processing steps.

2. Description of the Related Art

During the fabrication or repair or rework of various semiconductor and non-semiconductor devices and displays, films or layers of organic materials may be deposited on substrates or wafers that must be removed subsequently. Examples of such devices and displays include, but are not limited to, semiconductor devices and wafers, ceramic devices, liquid crystal display devices, photomasks, flat-panel displays, printed circuit boards, printed wiring boards, magnetic read-write heads, and thin-film read/write heads. Examples of such organic materials include, but are not limited to, photosensitive and non-photosensitive organic materials, polymerized photoresists, cured and uncured polyimides, polycarbonates, paints, resins, multi-layer organic polymers, certain organo-metallic complexes, positive optical photoresists, negative optical photoresists, chemically amplified photoresists, electron-beam photoresists, X-ray photoresists, ion-beam photoresists, and ion-implanted and other hardened photoresists.

The removal, cleaning, or stripping of such organic materials comprising, for example, organic coatings, films, layers, or residues from such substrates or wafers is one of the necessary steps in the manufacture and repair of the devices described above. The removal, cleaning and stripping of such organic materials is usually carried out by one of three general techniques, including (1) dry methods, which include dry-ashing or plasma ashing, dry-stripping, dry-etching, and the use of various procedures which make use of kinetic processes such as abrasives, cryogenic aerosol techniques, $CO_2$ snow, etc.; (2) wet methods, including the so-called RCA clean process (developed by RCA for use in cleaning semiconductor substrates), wet stripping with liquid chemicals such as, for example, sulfuric acid, hydrochloric acid, hydrogen peroxide, piranha etch (a mixture of sulfuric acid and hydrogen peroxide), ozonated deionized water (DI water), and ammonium hydroxide solutions, and the use of organic solvents, for example, various choline solutions, amine-based solutions, M-pyrrole, paint removers, etc.; and (3) a combination of both dry and wet methods, often in repeating sequences.

Dry methods often involve the use of a plasma of high-energy ions to remove organic materials (dry-ashing, or plasma ashing). There are two general categories of plasma methods employed. One of the plasma methods, often referred to as barrel-ashing, makes use of a stream of plasma directed at the substrate. The other method, often referred to as down-stream ashing, involves the use of a plasma gas atmosphere "downstream" (i.e. physically distant from) from the source of the plasma so as to minimize the damage to the substrate. Different plasma gases may be used, including those made up of various mixes of oxygen, ozone, and nitrogen gas, creating $CO$, $CO_2$ and $H_2O$ as end products (see, e.g., Silicon Processing for the VLSI Era, Volume 1—Process Technology, S. Wolf and R. N. Tauber, p 564, Lattice Press, Sunset Beach, Calif., 1986).

In some cases, a hydrogen plasma may be required to assist the dry process. For example, for very difficult-to-remove photoresists, hydrogen plasma may be used to strip the upper layer of hardened resist to create easy-to-strip hydrides (see, e.g. "Choose the Right Process to Strip Your Photoresist", Semiconductor International, February 1990, p. 83). In other cases, difficult-to-remove residues may require the addition of fluorine gas, or some other halogen gas, to the plasma gas mix, or even a follow-up exposure to hydrofluoric acid vapor (see, e.g. "Managing Etch and Implant Residue", Semiconductor International, August 1997, p. 62).

Several drawbacks are associated with plasma processes. These include: (1) radiation damage to the underlying substrate, where bombardment of the substrate by high-energy ion plasmas, particularly in the barrel-ashers, can damage the crystal structure of the substrate as well as implant undesired atoms in the substrate, thus reducing yield and reliability of substrate devices (although the damage may be minimized by annealing or by using down-stream ashers which minimize radiation damage at the cost of slower and less effective organic removal rates); (2) creation of additional contamination as high-dose ion plasmas striking impurities in the resist react to form etch-resistant, insoluble inorganic oxides (see, e.g., "New Concerns in Dry Oxygen Ashing", Semiconductor International, March 1996, p. 44); (3) worsening of the existing contamination typically found in commercial photoresists as the high-energy plasma drives existing metal impurities into the substrate; (4) formation of difficult-to-remove residues such as "via veils", and "metal fences" and the hardening of sidewall polymers as the result of the interaction of released by-products of plasma etching with the side-walls in the substrate structure at elevated temperatures; and (5) incomplete removal, cleaning and stripping of the photoresists and other organic materials from very small features due to micro-masking of the resists from further processing by sputtered oxides which may form as a result of high-energy ion impact.

Other dry methods are in use which do not require high-energy plasmas. However, these non-plasma methods suffer in general either from (1) low removal rates, (2) high-temperature processing conditions, (3) excessive damage to the substrate, for example, damage from mechanical abrasion caused by micro-sandblasting techniques such as, for example, cryogenic aerosols, the potential for damage created by temperature fluctuations such as, for example, $CO_2$ snow methods (see, e.g. "Emerging Technology; Emerging Markets", Precision Cleaning, October 1996, p. 14), and damage created by ultraviolet light exposure (UV-exposure), or (4) an inability to completely remove or strip organic materials which have been hardened by exposure to prior processing such as high temperature, or high energy, high dose, ion-implant.

Wet methods, including, for example, the RCA clean, specialized organic solvents, acids, and oxidizing solutions such as Caro's acid, and other liquid reagents, also have a number of drawbacks when used to remove, clean, or strip organic materials. These drawbacks include: (1) incomplete removal of organic materials due to the difficulty all liquids have in penetrating very small features and in overcoming surface tension and capillary cation; (2) incomplete removal due to a limited ability to affect certain organic materials, including photoresists, photoresist residues and organo-metallic complexes which have been hardened by exposure to high energy, high dose ion-implant, or high temperature processing; (3) further introduction of metallic impurities and other residual contamination commonly found in liquid reagents; (4) the spread of contamination to all parts of the substrate, particularly as trace organic residues accumulate in the cleaning solution during the stripping process; (5) the hazardous or toxic nature of many of the organic solvents and acids required; (6) the large volumes of hazardous or toxic reagents which must be maintained in a highly pure condition, often at elevated temperatures; (7) the large number of different types of reagents which must be kept at hand to deal with different cleaning applications and processing conditions; (8) the difficulty and cost of safely disposing of large volumes of hazardous or toxic reagents; and (9) the propensity of many liquid reagents to cause corrosion of the substrate, particularly when metal films are contained in the substrate.

The RCA clean process, a commonly used wet process which involves treatment with $NH_4OH/H_2O_2$ followed by $HCl/H_2O_2$, has similar drawbacks, which limit its effectiveness and application.

Despite the drawbacks of these various methods for removing, cleaning and stripping organic materials, dry methods in combination with wet methods, sometimes requiring several repetitions, must be used, for lack of better methods, to achieve acceptable levels of cleanliness when removing, cleaning and stripping certain very difficult-to-remove organic materials, particularly hardened photoresists. Hardening of photoresists as the result of prior processing is often a problem, making removal, cleaning and stripping difficult. Hardening of photoresists arises from several sources, including (1) exposure to high energy electromagnetic radiation normally used in photolithographic processes and very short wavelength, or deep UV, photoresist curing steps, (2) high energy, high dose ion-implant processes, (3) reactive ion etching processes (RIE), (4) high temperature processes such as postbake, photoresist curing steps, (5) oxide, metal or polysilicon dry etching, as well as other physical and chemical treatments. In addition, dry etching and dry-ashing processes often create extremely etch-resistant polymers and residues of inorganic or organo-metallic materials, such as sidewall polymers, via veils and metal fences (see, e.g., "What's Driving Resist Dry Stripping", Semiconductor International, November 1994, p. 61). Under such conditions, wet and dry methods in combination may be the only available technique which can provide satisfactory removal, cleaning and stripping of the organic material. Even under conditions where prior art is used in repeated sequential combinations of dry then wet processing, certain organic materials may still be resistant to satisfactory removal. For example, photoresists exposed to oxide etch processes leave carbon-fluorine polymers that are resistant to removal even with successive applications of dry and wet strip processes followed by an RCA clean.

The prior art thus suffers from numerous drawbacks that may be overcome with the teachings of the present invention. Such drawbacks include: (1) difficulty in removing hardened organic materials, including sidewall polymers, via veils, metal fences and other inorganic residues, and photoresists which may have been exposed to high-energy electromagnetic radiation such as UV-hardening (ultraviolet radiation hardening), or high energy, high dose ion-implant, or reactive ion etch (RIE); (2) difficulty in removing organic materials from very small features (generally sub-micron) and high aspect-ratio features without using substrate-damaging plasma methods; (3) the introduction of substrate damage or film erosion when plasma methods must be employed for lack of an effective alternative; (4) the creation of new, removal-resistant inorganic materials when plasma methods must be employed for lack of an effective alternative; (5) the worsening of existing contamination which may be driven into the substrate when plasma methods must be employed for lack of an effective alternative; (6) the introduction of additional contaminants when liquid reagents and solvents are used; (7) the spread of contamination between substrates when liquid reagent and solvent baths are used; (8) the difficulties and expense of buying, using and disposing of large volumes of hazardous or toxic liquid reagents and solvents; (9) the relative complexity of plasma-based methods which require radio-frequency or microwave generators as well as high-vacuum pumps and systems; (10) the difficulty in maintaining a uniform removal process across the diameter of the substrate when barrel-ashers are used and whenever a stripping process must be stopped by the calculation of an optimum end-point; (11) the relatively high temperature of many dry methods (200° C. and up) which can make some diffusion-related problems, such as the diffusion of impurities into the substrate, more severe (both diffusion of impurity materials and consumption of thermal budget may be concerns of the user, depending on the substrate manufacturing process employed); (12) the difficulty of scaling up dry-processes to handle substrates 12 inches in diameter and greater; (13) the difficulty of using the prior art when stripping organic materials from metal films without inviting corrosion of that metal film; (14) the poor selectivity of oxygen plasmas to photoresist over certain organic films lying in close proximity (such as the approximate 1:1 selectivity displayed by oxygen plasmas when used to remove photoresist in close proximity to the interlayer dielectric film material, BCB); and (15) the frequent requirement to develop and operate, complex and expensive multi-step, combination dry plus wet, removal processes in order to adequately clean hardened organic materials from substrates.

U.S. Pat. No. 5,037,506, issued Aug. 6, 1991, to S. Gupta et al and entitled "Method of Stripping Layers of Organic Materials", discloses and claims a two-step method comprising (1) exposure of organic materials to gaseous sulfur trioxide followed by (2) rinsing with a solvent to remove various organic coatings, polymerized photoresists, and especially implant and deep-UV hardened resist layers, during the manufacture of semiconductor or ceramic devices. While the method disclosed and claimed in this patent is useful, there are further needs for cleaning surfaces and removing organic materials which are not disclosed or claimed in this patent and which extend into other areas of technology. Specifically, those undisclosed and unclaimed needs include the need to remove, clean, and strip organic materials contained on a broad range of substrates including not just semiconductor devices, wafers, ceramic devices and printed circuit boards as suggested in the prior art, but also from substrates used in liquid crystal display devices, photomasks, flat-panel displays, printed wiring boards, magnetic read/write heads, thin-film read/write heads, as well as other substrates upon which organic films may have been deposited and which also contain features (1) where liquid stripping and cleaning methods are inadequate due to surface tension and capillary effects, or due to the contamination introduced and spread by liquids, (2) where plasma techniques result in substrate damage, erosion, or incomplete removal of the organic material, (3) where there is a requirement for improved uniformity of the removal method across the substrate diameter or large dimension than is provided by the prior art, (4) where there is a requirement for the removal of organic materials at a throughput rate which is faster than that provided by prior art, either with an inherently faster organic removal rate, or by providing for very large, batch processing capability, (5) where there is a requirement for more effective removal of silicon polymers, sidewall polymers, via veils, metal fences, and other inorganic residues created by dry etching processes, (6) where there is a requirement for an integrated method for cleaning both organic and inorganic residues with a minimum use of hazardous or toxic and other liquid wastes, (7) where there is a requirement to minimize or eliminate the corrosion of substrate metal films during organic cleaning, (8) where there is a requirement to integrate steps in the stripping and cleaning process in order to improve cycle time, work-in-process, and throughput, (9) where there is a requirement to minimize processing temperatures, or (10) where there is a requirement to remove or strip only part of the organic coating, film or layer, as may be required, as an example, in efforts to planarize or shape that coating, or to remove one organic coating from an underlying organic coating with significant selectivity.

As a result of the passage of time, it has become clear to the present inventors that there are additional considerations regarding the method of the above-mentioned patent that are required in order to improve the effectiveness of the method. As discussed herein, by effectiveness of the method is meant completeness of the organic removal process, elimination of substrate damage and erosion, improved uniformity of processing across the substrate, faster organic removal rate and substrate throughput, an increase in the number of substrates that can be processed simultaneously during one process cycle, minimization of corrosion of the substrate, minimization of total liquid wastes generated by the method, minimization of hazardous or toxic chemical usage, minimization of total process cycle time, minimization of process temperature requirements, and improved selectivity of removal for one type of organic coating lying in close proximity to a second type of organic coating. These additional considerations include: (1) a precursor chemical or physical treatment of the organic material and the substrate may be required prior to insertion of the substrate into the sulfur trioxide reaction chamber for exposure to the process gases; (2) reactive process gases other than inert gases, dry-nitrogen or sulfur trioxide, as specified in prior art, may also be required to be mixed in the sulfur trioxide reaction chamber with the sulfur trioxide; (3) reactive process gases other than sulfur trioxide may also be required to be introduced to the sulfur trioxide reaction chamber in a specific sequence, either before or after introduction of sulfur trioxide; (4) any one of the process gases may also be required to be replenished in the sulfur trioxide reaction chamber at regular intervals during the method; (5) all of the process gases in the sulfur trioxide reaction chamber may also be required to be in movement, and that movement may be required to be in a specific flow pattern, during the method; (6) while in the sulfur trioxide reaction chamber the temperature of the process gases and the substrate may also be required to follow a temperature-time curve; (7) the partial-pressure of any of the process gases in the sulfur trioxide reaction chamber may also be required to follow a partial-pressure versus time curve; (8) simultaneous physical treatment of the substrate (e.g., exposure to high-energy electromagnetic radiation such as ultraviolet light) may also be required during exposure to the process gases while contained within the exposure chamber; (9) it may be necessary to stop the process reactions within the sulfur trioxide reaction chamber prior to their completion and at a precise moment in time; (10) a pre-rinse chemical or physical treatment of the substrate may also be required after exposure to the process gases within the sulfur trioxide reaction chamber but prior to rinsing in a solution to remove reaction products; (11) application of simultaneous physical processes such as, for example, ultrasonic or megasonic processes, or various other kinetic processes, are required while rinsing the substrate in a solution to remove reaction products as described in prior art; and (12) a post-rinse chemical or physical treatment of the substrate may also be required after rinsing in a solution to remove reaction products.

What is needed is a method which satisfies these considerations for effectively removing, stripping, or cleaning organic coatings, films, layers, and residues consisting of, for example, photosensitive and non-photosensitive organic materials, polymerized photoresists, cured and uncured polyimides, polycarbonates, paints, resins, multi-layer organic polymers, certain organo-metallic complexes, positive optical photoresists, negative optical photoresists, chemically amplified photoresists, electron-beam photoresists, X-ray photoresists, ion-beam photoresists, and ion-implanted and other hardened photoresists from a variety of substrates used in devices such as semiconductor devices and wafers, ceramic devices, liquid crystal display devices, photomasks, flat-panel displays, printed circuit boards, printed wiring boards, magnetic read-write heads, and thin-film read/write heads, as well as other substrates upon which organic films may have been deposited.

SUMMARY OF THE INVENTION

In accordance with the present invention, an improved method is provided for partially or completely removing organic material from a substrate. The method comprises:
(1) subjecting the substrate with the organic material thereon to a vapor consisting essentially of water-free gaseous sulfur trioxide for a period of time to at least partially react the organic material with the sulfur trioxide, the substrates being maintained at a temperature in the range from about room temperature to 400° C.; and
(2) subjecting the substrate to a solvent rinse to at least partially remove the reacted organic material;
wherein the improvement comprises the following steps:
(a) providing the substrate with the organic material thereon;
(b) subjecting the substrate of step (a) to a precursor chemical or physical treatment prior to step (1) capable of facilitating the reaction of the sulfur trioxide with the organic material to be removed;
(c) carrying out step (1) so that the water-free, gaseous sulfur trioxide reacts with the organic material to form reacted and unreacted organic matter;
(d) optionally, subjecting said organic coatings, films, layers or residues to a pre-rinse chemical or physical treatment;
(e) carrying out step (2) to remove the reacted and unreacted organic matter from the substrate; and
(f) subjecting the substrate to a chemical or physical post-rinse treatment subsequent to step (2) capable of removing any residual organic matter from the substrates remaining after the solvent rinse.

The sulfur trioxide, which acts as a removal, cleaning, and stripping agent, oxidizes, sulfonates, sulfates, sulfamates, or otherwise reacts, to cause all types of organic coatings, films, layers, and residues to be substantially completely removable by subsequent chemical or physical treatment.

After preparing the sulfur trioxide reaction chamber for use by first flushing it with inert gases, substrates upon which organic coatings, films, layers and residues have been deposited, regardless of the method of deposition, are exposed to regulated quantities of water-free gaseous sulfur trioxide and other process gases. These gases are dispensed into chambers, or a series of closed chambers with good vacuum integrity, which contain the substrates. Additional chemical and physical treatments are employed prior to and subsequent to, and optionally during, exposure to these process gases for the purpose of improving the effectiveness of the method. Liquid or solid sulfur trioxide, whether in alpha, beta, or gamma form, or a mixture thereof, may be stored and used as the source of vapor. Sulfur trioxide is an extremely strong oxidizing and sulfonating chemical, and is very effective as an agent in removing, cleaning and stripping a variety of organic materials. Sulfur trioxide gas is particularly effective as an agent in removing, cleaning and stripping organic materials such as plasma-hardened photoresists, carbon-fluorine containing polymers, UV-hardened photoresists, and side-wall polymers from sub-micrometer grooves and crevices. Being in a gas phase, sulfur trioxide achieves a more thorough contact with the surfaces of sub-micrometer grooves and crevices than is possible by liquid solutions.

The present invention for removing, cleaning, or stripping a wide variety of organic materials which may be deposited or formed on substrates suring the manufacture, repair or rework of those substrates may be carried out over a temperature range which is unlimited with regard to the effectiveness of the method. However, some embodiments of this invention require a temperature range between room temperature and 400° C. for optimum effectiveness for specific materials and substrates.

Examples of substrate materials which may be beneficially treated in accordance with the present invention include, but are not limited to, materials specifically used in the manufacture and repair of semiconductor wafers and devices, such as silicon, polysilicon, germanium, III-V compound semiconductors (e.g. gallium arsenide), oxides (both crystalline and glassy), nitrides, oxynitrides, organic films, organic dielectrics (e.g. polyimides, benzocyclobutene), organo-metallic complexes and polymers, metals and metal alloys.

Additional examples of substrate materials which may be beneficially treated in accordance with the present invention include materials such as glass, polycarbonates, and cured and uncured polyimides.

The use of the method as described herein provides for more efficient, more effective, and more environmentally benign processing of semiconductor devices and wafers, ceramic devices, liquid crystal display devices, photomasks, flat-panel displays, printed circuit boards, printed wiring boards, magnetic read-write heads, and thin-film read/write heads, as well as other substrates upon which organic films may have been deposited and which contain very small features, namely, micron and sub-micron, than is available using prior art approaches.

BRIEF DESCRIPTION OF THE DRAWINGS

The sole FIGURE depicts a flow chart of the method of the present invention.

DETAILED DESCRIPTION OF THE INVENTION

Figure 1:
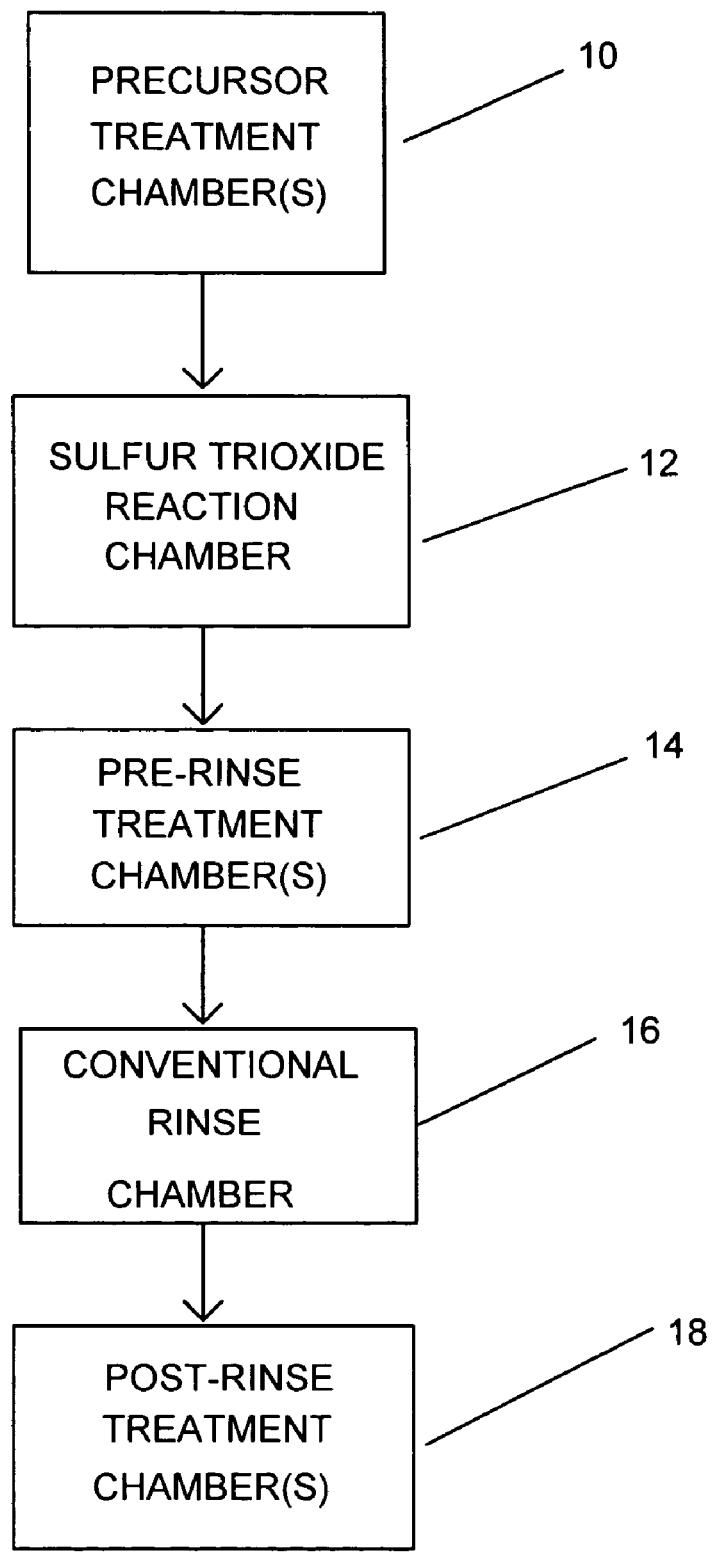

Details of a specific embodiment of the present invention are described to illustrate the best mode presently contemplated by the inventors for practicing the invention. Alternative embodiments are also briefly described as applicable.

An improved method is provided herein for the complete removal, cleaning and stripping of organic coatings, films, layers, and residues consisting of, for example, photosensitive and non-photosensitive organic materials, polymerized photoresists, cured and uncured polyimides, polycarbonates, paints, resins, multi-layer organic polymers, certain organo-metallic complexes, positive optical photoresists, negative optical photoresists, chemically amplified photoresists, electron-beam photoresists, X-ray photoresists, ion-beam photoresists, and ion-implanted and other hardened photoresists from a variety of substrates used in devices such as semiconductor devices and wafers, ceramic devices, liquid crystal display devices, photomasks, flat-panel displays, printed circuit boards, printed wiring boards, magnetic read-write heads, and thin-film read/write heads, as well as other substrates upon which organic films may have been deposited. As used herein, the term "organic materials" refers to organic coatings, films, layers, and residues.

The method comprises:
(1) subjecting the substrate with the organic material thereon to a vapor consisting essentially of water-free gaseous sulfur trioxide for a period of time to at least partially react the organic material with the sulfur trioxide, the substrates being maintained at a temperature in the range from about room temperature to 400° C.; and
(2) subjecting the substrate to a solvent rinse to at least partially remove the reacted organic material;
wherein the improvement comprises the following steps:
(a) providing the substrate with the organic material thereon;
(b) subjecting the substrate of step (a) to a precursor chemical or physical treatment prior to step (1) capable of facilitating the reaction of the sulfur trioxide with the organic material to be removed;
(c) carrying out the step (1) so that the water-free, gaseous sulfur trioxide reacts with the organic material to form reacted and unreacted organic matter;
(d) optionally, subjecting said organic coatings, films, layers or residues to a pre-rinse chemical or physical treatment;
(e) carrying out the step (2) to remove the reacted and unreacted organic matter from the substrate; and
(f) subjecting the substrate to a chemical or physical post-rinse treatment subsequent to step (2) capable of removing any residual organic matter from the substrates remaining after the solvent rinse.

Steps (b), (c), (d), (e), and (f) may independently be performed more than once, as needed, to completely remove all organic material that is desired to be removed.

The advantages of the disclosed method are as follows:
(a) it does not make use of liquid stripping, including, as examples, organic and inorganic solvents and acids,
(b) it does not make use of plasma processes, including, as examples, dry-ashing, barrel ashing, or down-stream ashing,
(c) it is effective for completely removing, cleaning, or stripping some organic materials at process temperatures below 200° C.,
(d) it provides better uniformity of removal, clean, or strip across the substrate than can be provided by plasma stripping or cleaning processes which require end-point detection to determine an optimum time to stop the process,
(e) it provides better uniformity of removal, clean, or strip between individually processed substrates than can be provided by plasma stripping or cleaning processes which require end-point detection to determine an optimum time to stop the process, (f) it provides improved selectivity of removal between organic films of two different types which may be in close proximity, such as in the case of organic photoresist and organic interlayer dielectric films, and (g) it may be embodied, effectively, as part of an integrated cleaning process for cleaning and removing inorganic materials as well as organic materials.

The method of the present invention has been designed and developed to remove, clean or strip the organic materials enumerated above that may have been deposited by design, or as a result of intended or unintended chemical and physical processes needed for manufacture and repair, on the substrates employed in the devices enumerated above.

It is an important feature of the present invention that, unlike dry and wet stripping and cleaning methods described in prior art, this method can completely remove, clean and strip hardened photoresist coatings and residues, such as polymerized photoresists, ion-implanted and deep-UV hardened photoresist layers, side-wall polymers, metal fences, via veils, and other photoresist residues without damaging the underlying substrates and without using hazardous or toxic liquid chemicals.

The basic concept behind the present invention is that a chemical agent, namely, sulfur trioxide, under the appropriate processing conditions, and when used in conjunction with the appropriate physical and chemical treatments applied at the appropriate time(s) during the process, is used in gaseous form to oxidize, sulfonate, sulfate, sulfamate, or otherwise react with a wide variety of organic materials which may be deposited or formed on substrates during the manufacture, repair or rework of these substrates so as to cause the desired organic materials to be substantially removed, cleaned, or stripped from the surface of the substrate. Sulfur trioxide, being a highly reactive agent, is very effective when used in removing, cleaning and stripping a variety of hardened organic materials. The gaseous form of sulfur trioxide, coupled with its reactive power, is also an agent which provides for very effective removal, cleaning and stripping of a variety of organic materials from sub-micrometer grooves and crevices of exposed substrates. Being in a gas phase, sulfur trioxide does not suffer from the surface tension and capillary-action effects that limit the action of liquid solutions by preventing contact with the walls of such grooves and crevices.

The present invention thus provides (1) a method for applying an extremely powerful reactive agent to very small grooves and crevices not easily accessible by liquid agents, so as to cause organic materials to be substantially removed, cleaned or stripped from those grooves and crevices; (2) a method for removing, cleaning and stripping organic materials without the use of large volumes of hazardous or toxic solvents and reagents; (3) a method for removing, cleaning and stripping organic materials which is effective at between room temperature and 200° C.; (4) a method for removing, cleaning and stripping organic materials which is easily integrated into inorganic cleaning and stripping processes; (5) a method for partially or completely removing organic materials uniformly across the substrate; (6) a method for selectively, and completely, removing organic materials without damaging certain organic coatings of a different type which may lie in close proximity; and (7) a method for partially or completely removing organic materials uniformly between individually processed substrates.

In the method of the present invention, sulfur trioxide, which may be in alpha form, beta form, gamma form or a mixture thereof, is stored and used as the primary oxidizing, sulfonating, sulfating, sulfonating and otherwise reactive agent. Gamma-sulfur trioxide, with a melting point of 16.8° C., is the preferred form for sulfur trioxide to be used in the invention, and is the form in which $SO_3$ exists when it is maintained in absolutely pure and anhydrous condition. In general, stabilized gamma-sulfur trioxide is used, where addition of a small quantity of inhibitor (stabilizer) prevents formation of the high melting-point beta (32.5° C.) and alpha (62.3° C.) forms. Gamma-sulfur trioxide is commercially available with such inhibitors. The stabilized sulfur trioxide can readily be remelted, if it is allowed to solidify. Both stabilized and unstabilized sulfur trioxide may be used in the method of this invention. Water-free, gaseous sulfur trioxide is employed in the removal of the organic coatings, films, layers, and residue. It is an important requirement of this method to eliminate or minimize the introduction of water or water vapor to the sulfur trioxide gas at the appropriate time in the practice of the method, and to control the water content during the course of the practice of the method. To the extent that water is present during the exposure to the sulfur trioxide gas, the effectiveness of the method decreases.

The removal, cleaning and stripping method of the present invention is advantageously embodied in both batch (multiple substrates) and single-substrate operation modes in a method illustrated by the flow chart shown in FIG. 1. The method comprises several steps where the substrate containing the organic coating, film, layer or residue to be removed is first treated with a precursor physical or chemical treatment in one or more chambers in Step 10 to prepare it for exposure to gaseous sulfur trioxide so as to facilitate the reaction of the sulfur trioxide with the organic material to be removed. Precursor physical or chemical treatments include, for example, physical treatments with heat, high-energy electromagnetic radiation, such as infrared radiation (IR), ultra-violet light radiation (UV), or laser energy; or chemical treatments with reactive and non-reactive gases or liquids, including, for example, oxygen, nitrous oxide, steam, vapor phase hydrogen peroxide, nitrogen, or various solvents.

The precursor chemical treatment employs gases or liquids that are present in an amount to facilitate the reaction of the sulfur trioxide with the organic materials. As an example, if nitrous oxide were selected, the amount used would, of course, be far greater than that which is present in air (0.00005 vol %), since such a minimal amount would not be effective in facilitating the reaction of $SO_3$ with organic materials, at least within any reasonable time scale for device manufacturing. Rather, such gases would consist either solely of the enumerated gases, or a mixture thereof, or a mixture of an enumerated gas with a gas not listed above where the enumerated gas is the major component.

After completion of the appropriate precursor Step 10, the substrate is then placed in the sulfur trioxide reaction chamber in Step 12 for exposure to gaseous sulfur trioxide. In some embodiments of the present invention, it is convenient to conduct the precursor step (1) and the sulfur trioxide exposure step (2) within the same physical reaction chamber. In other embodiments, several chambers may be required for these two steps. In any case, during the sulfur trioxide exposure step, and as described in prior art, regulated quantities of gaseous sulfur trioxide are dispensed, continuously or at appropriate intervals, into closed, vacuum-sealed chamber(s), which are required primarily to minimize and control the moisture level during sulfur trioxide exposure. Moisture level may also be minimized and controlled by maintaining the walls of the chamber(s) at elevated temperatures. The flow rate and pressure of sulfur trioxide gas and other process gases, and the time of exposure needed for the sulfur trioxide exposure step in the method will depend on the size of chamber(s) and the quantities of substrates, and their sizes, to be subjected to the exposure at one time.

After introduction of the substrate to be cleaned or stripped into the chamber, the chamber is purged, one or several times, with a dry inert gas, such as nitrogen or one of the commonly used inert gases, such as argon. The chamber is then evacuated to a suitable vacuum, such as on the or der of about $10^3$ Torr. Water-free, gaseous sulfur trioxide is then introduced into the chamber as a reactive agent for removing, cleaning or stripping the organic materials contained on the substrates. While the time of exposure of the substrate to the gaseous sulfur trioxide and other process gases varies depending on several factors, as indicated above, the typical time of exposure is less than five minutes. Depending upon the nature of the organic material to be removed, cleaned or stripped, the number of substrates in the sulfur trioxide reaction chamber, the size of each substrate, and other processing conditions, longer times or repeated exposures may be needed. However, the determination of the time for a particular organic material, substrate, and set of processing conditions is easily done, and constitutes no undue experimentation.

The substrate may be maintained at room temperature during exposure to the gaseous sulfur trioxide or heated to an elevated temperature. If heated, the temperature is not a limitation of the method. Temperature of the substrate and the processing environment is controlled, and may be limited, in order to in order to improve the effectiveness of the method. Typically, the temperature range is between room temperature and 400° C. As used herein, the term "room temperature" refers to the ambient temperature of the facility in which the process is being carried out, and is typically in the range of about 230 to 25° C.

During the sulfur trioxide exposure step, although undisclosed by prior art, it may be necessary to apply one or more simultaneous physical or chemical treatments while the substrate resides within the sulfur trioxide reaction chamber. Simultaneous physical or chemical treatments include, for example, physical treatments with high-energy electromagnetic radiation, such as infrared radiation, UV radiation, laser energy; directional flow of the process gases through the chamber by means of the physical design of the sulfur trioxide reaction chamber; or chemical treatments by means of the introduction of reactive gases in addition to sulfur trioxide and nitrogen, such as vaporized solvents or nitrous oxide, in order to improve the effectiveness of the method. In the preferred embodiment of this invention, simultaneous treatments are not precisely coincident with the presence of sulfur trioxide gas within the sulfur trioxide reaction chamber. The required timing for each of the simultaneous physical or chemical treatments within the sulfur trioxide reaction chamber depends on the nature of the organic material and the set of prior processing conditions experienced by the organic material.

Exposure to sulfur trioxide results in a chemical reaction of the $SO_3$ with the organic material on the substrate. Such reaction is desirably complete, resulting in reacted organic matter. However, for a variety of reasons, the chemical reaction may be incomplete, resulting in partially reacted organic matter, thereby yielding a mixture of reacted and unreacted organic matter. The substrate with reacted and unreacted organic matter is then further processed, as described below.

After completion of the sulfur trioxide exposure step, the substrate may optionally be treated to one or more pre-rinse physical or chemical treatments in one or more chambers, as shown in Step 14, to facilitate the removal of the reacted and unreacted organic matter which remains on the substrate after the sulfur trioxide exposure step. Pre-rinse physical or chemical treatments include, for example, physical treatments with heat, high-pressure de-ionized water (DI water) sprays, treatment with sound energy such as megasonic or ultrasonic treatments, exposure to laser energy, or kinetic treatments such as physical scrubbing, or exposure to a $CO_2$ snow process; or chemical treatments with various reactive gases such as oxygen, nitrous oxide, steam, and vapor phase hydrogen peroxide, or solutions or solvents, including for example, various acidic or alkaline solutions or amine-based solutions.

After completion of the optional, appropriate pre-rinse physical or chemical treatment Step 14, the substrate is then processed through one of the conventional, or standard, rinse treatments in chamber, as shown in Step 16, as described in the prior art. Such rinse comprises use of a rinse solvent, such as water, a lower alkanol (1 to 5 carbon atoms), acetone, or mixtures thereof, various acidic or alkaline solutions or amine-based solutions. (During the rinse treatment of Step 16, the substrate may be subjected to one or more physical treatments, such as heat, high-pressure de-ionized (DI) water sprays, treatment with sound energy such as megasonic or ultrasonic treatments or exposure to laser energy.

After completion of the conventional rinse treatment of Step 16, the substrate is next treated with one or more post-rinse physical or chemical treatments in one or more chambers, as shown in Step 18, to further facilitate the removal of any residual organic material (e.g., reacted and unreacted organic matter) which remains on the surface of the substrate after the standard rinse step. Post-rinse physical or chemical treatments include, for example, physical treatments with heat, high-energy electromagnetic radiation, such as infrared radiation (IR), ultra-violet light radiation (UV), or laser energy, high-pressure DI-water sprays, treatment with sound energy such as megasonic or ultrasonic treatments, exposure to laser energy, or kinetic treatments such as physical scrubbing, or exposure to a $CO_2$ snow process; or chemical treatments with various reactive gases such as oxygen, nitrous oxide, steam, and vapor phase hydrogen peroxide, or solutions or solvents, including for example, various acidic or alkaline solutions commonly employed in photoresist stripping, choline, or amine-based solutions employed in photoresist stripping.

If employed in any of the treatment steps, high-pressure Dl water sprays are performed with deionized water under pressure of about 350 to 2,500 psi, preferably about 1,200 psi, employing either a fan nozzle or a jewel-tip nozzle. The water may be cooled or heated, if desired, within the range of just above freezing to just below boiling.

The method of the present invention has no deleterious effect on the surface of many of the inorganic substrate or on the inorganic coatings thereon. For example, surface oxides, such as silicon oxide and oxide glasses, nitrides, oxynitrides, many metals, silicides, silicon, polysilicon, and the like are unaffected by the process.

Without subscribing to a particular theory and independent of the details of the sulfur trioxide reactions, the underlying principle of the operation in the invention is the exhaustive oxidation, sulfonation, sulfation, sulfamation, or other chemical reaction with the organic material which is made possible by the access of sulfur trioxide vapor to all parts of the substrate surface, including grooves, crevices and all sub-micrometer structures thereon, in conjunction with the correct physical and chemical treatments applied at the appropriate time during the process. The method of the invention can be carried out whether sulfur trioxide is used in the form of pure or stabilized gas, or vaporized from a pure or stabilized liquid, or solid, sulfur trioxide source. The method of the invention equally applies when the reactivity of the sulfur trioxide vapor is obtained from a mixture of chemical substances, in gaseous, liquid, or solid form, with the net effect of producing sulfur trioxide vapor, in pure form or otherwise, at the rate and quantity needed to carry out specific removal, cleaning or stripping reactions.

In certain embodiments of the present invention, complete reaction of the organic materials with the process gases, including sulfur trioxide, occurs rapidly from surfaces of substrates including, as examples, semiconductor wafers, such as silicon, polysilicon, germanium, III-V compound semiconductors (e.g., gallium arsenide), oxides (both crystalline and glassy), nitrides, oxynitrides, organic films, organic dielectrics (e.g., polyimides, benzocyclobutene), organo-metallic complexes and polymers, metals and metal alloys.

In certain other embodiments of the present invention, not described in the prior art, incomplete reaction may be desired during the sulfur trioxide exposure step, as in the case when the substrate contains an organic coating, film, or layer to be only partially removed or stripped from the substrate. In such embodiments, various physical or chemical mechanisms are required to cause cessation of the reaction with the process gases at the appropriate time (which may be identified, for example, with an end-point detector). Examples of appropriate mechanisms for halting or slowing the reaction include (1) application of chemical processes, such as the replacement of the highly reactive process gases with less reactive gases, (2) application of physical processes which affect the reaction, such as electromagnetic radiation including infrared, ultra-violet light radiation (UV), and higher energy wave lengths, (3) application of heat to the substrate so as to change the thermal characteristics of the substrate, (4) withdrawal of the substrate from the sulfur trioxide reaction chamber, and (5) replacement of the reactive process gases with inert gases.

In general, the method of the present invention has the capability to remove, clean or strip organic materials with different histories of prior physical and chemical processing including exposure to electromagnetic radiation of various wavelengths including ultra-violet light radiation (UV), exposure to plasma treatment, and exposure to chemical processes which may change the properties of the organic material. In particular, resists and polymers which are exposed to deep-UV, ion-implant, reactive ion etch (RIE), dry and wet etching, and other harsh plasma treatments can readily and efficiently be removed, cleaned or stripped by means of the reaction with sulfur trioxide gas.

The method of the present invention remains equally effective when sub-micrometer structural features are added to the substrate.

The chemical and physical properties of the organic materials, as well as the method of deposition on the substrate is not critical to the method of the present invention. The organic materials may include, for example, aromatic and aliphatic resists, deposited unintentionally by prior processing activities or intentionally by any organic coating method including roller application, dipping, brushing, spraying, the use of sheets of dry resist, spinon, electrophoresis, plasma deposition, chemical vapor deposition and other techniques for applying organic coatings, films and layers.

Examples of specific removal, cleaning and stripping applications include applications to organic polymer removal, for example, photoresist stripping, BCB (benzocyclobutene) stripping, post-plasma etch cleaning (for example, via cleaning, contact cleaning), stringer polymer removal, metal fence and via veil residue cleaning, silicon polymer removal, cured and uncured polyimide stripping, and poly-carbonate stripping. Side-wall polymers, silicon polymers, stringer polymers, via veils and metal fences are those complex polymers formed typically, but not exclusively, during reactive ion etch (RIE). Difficulty in cleaning these polymers and residues is a notable drawback of the prior art which can be overcome with the method of this invention. These polymers may contain metals, metal oxides, etchants, and other inorganic by-products of the RIE which make them difficult to remove solely with prior art such as that describing oxygen-based plasma processes (for example, dry-ashing), or such as that describing only a sulfur trioxide exposure step followed by a standard rinse step. These polymers are amenable to removal, cleaning and stripping with the method of this invention. Failure to adequately remove these materials can lead to contamination which has negative impact on device yields and reliability.

Other examples of specific removal, cleaning and stripping applications, include application to stripping organic coatings, films, or layers from a variety of substrates used in devices such as semiconductor devices and wafers, ceramic devices, liquid crystal display devices, photomasks, flat-panel displays, printed circuit boards, printed wiring boards, magnetic read-write heads, and thin-film read/write heads, as well as other substrates upon which organic films may have been deposited.

Still other specific examples include application to shaping organic coatings, films or layers where only partial removal of an organic coating, film or layer is required. Shaping organic coatings, films or layers may be required in the incorporation of dielectric films and layers in various devices, and in the improvement of lithographic processes for the manufacture and repair of.

Examples of organic coatings, films or layers that may be beneficially treated in accordance with the present invention include organic dielectrics. Such organic dielectrics include polyimides, copolyimides, polyamides, polyamide-imdes, fluorinated polyimides, poly(arylenethers), fluorinated poly(arylenethers), perfluorinated alkylene oxides, parylene (N, C, D, or F type), poly(phenylquinoxalines), poly-naphthalene, poly-fluorinated naphthalene, benzocyclobutene (BCB), amorphous fluoropolymers, such as polytetrafluoroethylene, perfluorocyclobutane aromatic ether (PFCB), and fluorinated carbon.

Thus, there has been disclosed a process for removal, cleaning and stripping, in whole or in part, organic materials from various types of surfaces. It will be readily apparent to those skilled in this art that various changes and modifications of an obvious nature may be made, and all such changes and modifications are considered to fall within the scope of the claims as defined by the appended claims.

What is claimed is:

1. An improved method for partially or completely removing organic coatings, films, layers or residues from a substrate, said method comprising:
   (1) subjecting said substrate with said organic material thereon to a vapor consisting essentially of water-free gaseous sulfur trioxide for a period of time to at least partially react said organic material with said sulfur trioxide, said substrates being maintained at a temperature in said range from about room temperature to 400° C.; and
   (2) subjecting said substrate to a solvent rinse to at least partially remove said reacted organic material;
wherein said improvement comprises said following steps:
   (a) providing said substrate with said organic material thereon;

(b) subjecting said substrate of step (a) to a precursor chemical or physical treatment prior to step (1) capable of facilitating said reaction of said sulfur trioxide with said organic material to be removed;

(c) carrying out said step (1) so that said water-free, gaseous sulfur trioxide reacts with said organic material to form reacted and unreacted organic matter;

(d) optionally, subjecting said organic coatings, films, layers or residues to a pre-rinse chemical or physical treatment;

(e) carrying out said step (2) to remove said reacted and unreacted organic matter from said substrate; and (f) subjecting said substrate to a chemical or physical post-rinse treatment subsequent to step (2) capable of removing any residual organic matter from said substrates remaining after said solvent rinse.

2. The method of claim 1 wherein said substrate consists of at least one portion of a device selected from the group consisting of semiconductor devices and wafers, liquid crystal display devices, flat-panel displays, printed circuit boards, magnetic read/write heads, and thin-film read/write heads.

3. The method of claim 2 wherein said substrate is selected from the group consisting of Group IV elements, III-V compound semiconductors, oxides, nitrides, oxynitrides, organic films, organic dielectrics, organo-metallic complexes and polymers, metals, and metal alloys.

4. The method of claim 3 wherein said Group IV elements are selected from the group consisting of silicon, polysilicon, and germanium, said III-V compound semiconductors consist essentially of gallium arsenide, said oxides are selected from the group consisting of crystalline and glassy oxides, and said organic dielectrics consist essentially of an organic polymer.

5. The method of claim 4, wherein said organic polymer is selected from the group consisting of polyimides, copolyimides, polyamides, polyamide-imides, fluorinated polyimides, poly(arylenethers), fluorinated poly(arylenethers), perfluorinated alkylene oxides, parylene (N, C, D, or F type), poly(phenylquin-oxalines), poly-naphthalene, poly-fluorinated napthhalene, benzocyclobutene (BCB), amorphous fluoropolymers, such as polytetrafluoroethylene, perfluoro-cyclobutane aromatic ether (PFCB), and fluorinated carbon.

6. The method of claim 1 further including:

in step (b) subjecting said organic material to said precursor chemical or precursor physical treatment, including, prior to said subjecting (a1) placing said substrate in a chamber, and (a2) purging said chamber with a dry inert gas;

in step (1) introducing said vapor consisting essentially of water-free gaseous sulfur trioxide into said chamber or in a separate chamber to react with said organic material, including allowing said period of time to pass to permit reaction between said sulfur trioxide and said organic material; and in step (c) ending said reaction between said sulfur trioxide and said organic material by subjecting said substrate to an end-point chemical or end-point physical treatment.

7. The method of claim 6 wherein said dry, inert gas consists essentially of nitrogen or argon.

8. The method of claim 1 wherein said precursor chemical treatment is selected from the group consisting of exposure to chemically active process gases, chemically inert process gases, and solvents, present in an amount to facilitate said reaction of said sulfur trioxide with said organic coatings, films, layers or residues.

9. The method of claim 8 wherein said chemically active process gases are selected from the group consisting of oxygen, nitrous oxide, steam, and vapor phase hydrogen peroxide and wherein said chemically inert process gases are selected from the group consisting of nitrogen and argon.

10. The method of claim 9 wherein said solvents are selected from the group consisting of water, lower alkanols, acetone, acids, bases, choline, amine-based solutions, and mixtures thereof.

11. The method of claim 1 wherein said precursor physical treat-ment is selected from the group consisting of exposure to heat, ultra-violet radiation, laser energy, kinetic energy, high-pressure deionized water sprays, physical scrubbing, ultrasonic and megasonic sound energy.

12. The method of claim 1 wherein said precursor chemical or physical treatment is carried out at a temperature between room temperature and 400(C.

13. The method of claim 1 wherein said solvent rinse is performed in a solvent selected from the group consisting of water, lower alkanols, acetone, acids, bases, choline, amine-based solutions, and mixtures thereof.

14. The method of claim 1 wherein said solvent rinse is simultaneously carried out in the presence of megasonic or ultrasonic energy, heat, ultra-violet radiation, or laser energy.

15. The method of claim 1 wherein said post-rinse chemical treatment is selected from the group consisting of further exposure to chemically active process gases or vapors, chemically inert process gases, and solvents, present in an amount to facilitate said removal of any residual organic material from said substrates remaining after said solvent rinse.

16. The method of claim 15 wherein said chemically active process gases are selected from the group consisting of oxygen, nitrous oxide, steam, and vapor phase hydrogen peroxide and wherein said chemically inert process gases are selected from the group consisting of nitrogen and argon.

17. The method of claim 15 wherein said solvents are selected from the group consisting of water, lower alkanols, acetone, acids, bases, choline, amine-based solutions, and mixtures thereof.

18. The method of claim 1 wherein said post-rinse physical treatment is selected from the group consisting of further exposure to heat, ultra-violet radiation, laser energy, kinetic energy, high-pressure deionized water sprays, physical scrubbing, CO2 snow processing, ultrasonic and megasonic sound energy.

19. The method of claim 1 wherein said post-rinse chemical or physical treatment is carried out at a temperature between room temperature and 400(C.

20. The method of claim 1 wherein step (c) further comprises subjecting said organic materials to simultaneous exposure to a component selected from the group consisting of other chemically active process gases and vapors, chemically inert process gases, vaporized solvents, heat, ultra-violet radiation, and laser energy.

21. The method of claim 20 wherein said chemically active process gases are selected from the group consisting of oxygen, nitrous oxide, steam, and vapor phase hydrogen peroxide and wherein said chemically inert process gases are selected from the group consisting of nitrogen and argon.

22. The method of claim 20 wherein said solvents are selected from the group consisting of water, lower alkanols, acetone, acids, bases, choline, amine-based solutions, and mixtures thereof.

23. The method of claim 1 wherein each said subjecting step is independently performed for a period of time up to about 5 minutes.

24. The method of claim 1 wherein said organic materials are selected from the group consisting of polymerized photoresists, paints, resins, single and multilayer organic polymers, organo-metallic complexes, positive optical photoresist, negative optical photoresist, electron-beam photoresists, X-ray photoresists, ion-beam photoresists, ion-implanted photoresists, and other hardened photoresists, wherein said organic polymers are selected from the group consisting of polyimides, copolyimides, polyamides, polyamide-imides, fluorinated polyimides, poly(arylenethers), fluorinated poly(arylenethers), perfluorinated alkylene oxides, parylene (N, C, D, or F type), poly(phenylquin-oxalines), poly-naphthalene, poly-fluorinated napththalene, benzocyclobutene (BCB), amorphous fluoropolymers, such as polytetrafluoroethylene, perfluorocyclobutane aromatic ether (PFCB), and fluorinated carbon.

25. The method of claim 1 further comprising: subjecting said organic coatings, films, layers or residues to said pre-rinse chemical or physical treatment.

26. The method of claim 25 wherein said pre-rinse chemical treatment is selected from the group consisting of further exposure to chemically active process gases or vapors, chemically inert process gases, and solvents.

27. The method of claim 26 wherein said chemically active process gases are selected from the group consisting of oxygen, nitrous oxide, steam, and vapor phase hydrogen peroxide and wherein said chemically inert process gases are selected from the group consisting of nitrogen and argon.

28. The method of claim 26 wherein said solvents are selected from the group consisting of water, lower alkanols, acetone, acids, bases, choline, amine-based solutions, and mixtures thereof.

29. The method of claim 25 wherein said pre-rinse physical treatment consists of further exposure to a component selected from the group consisting of heat, ultra-violet radiation, laser energy, kinetic energy, high-pressure deionized water sprays, physical scrubbing, CO2 snow processing, ultrasonic and megasonic sound energy.

30. The method of claim 25 wherein said pre-rinse chemical or physical treatment is carried out at a temperature between room temperature and 400(C.

* * * * *